(12) United States Patent
Zhang et al.

(10) Patent No.: US 11,804,537 B2
(45) Date of Patent: Oct. 31, 2023

(54) CHANNELED IMPLANTS FOR SIC MOSFET FABRICATION

(71) Applicant: Applied Materials, Inc., Santa Clara, CA (US)

(72) Inventors: Qintao Zhang, Mt. Kisco, NY (US); Samphy Hong, Saratoga Springs, NY (US); Wei Zou, Lexington, MA (US); Hans-Joachim L. Gossmann, Summit, NJ (US)

(73) Assignee: Applied Materials, Inc., Santa Clara, CA (US)

( * ) Notice: Subject to any disclaimer, the term of this patent is extended or adjusted under 35 U.S.C. 154(b) by 114 days.

(21) Appl. No.: 17/307,809

(22) Filed: May 4, 2021

(65) Prior Publication Data

US 2022/0359710 A1  Nov. 10, 2022

(51) Int. Cl.
*H01L 29/66* (2006.01)
*H01L 29/16* (2006.01)
*H01L 21/04* (2006.01)
*H01L 29/10* (2006.01)
*H01L 29/78* (2006.01)
*H01L 29/06* (2006.01)

(52) U.S. Cl.
CPC ...... *H01L 29/66068* (2013.01); *H01L 21/047* (2013.01); *H01L 29/0634* (2013.01); *H01L 29/1095* (2013.01); *H01L 29/1608* (2013.01); *H01L 29/7813* (2013.01)

(58) Field of Classification Search
CPC ............. H01L 29/66068; H01L 21/047; H01L 29/0634; H01L 29/1095; H01L 29/1608; H01L 29/7813
See application file for complete search history.

(56) References Cited

U.S. PATENT DOCUMENTS

| | | | |
|---|---|---|---|
| 2021/0193435 A1* | 6/2021 | Jelinek | ................ H01L 29/0623 |
| 2022/0013636 A1* | 1/2022 | Otsuka | ............. H01L 29/66348 |
| 2022/0223730 A1* | 7/2022 | Hung | .................. H01L 29/1608 |

OTHER PUBLICATIONS

Masuda et al., "0.63 mΩcm² / 1170 V 4H-SiC Super Junction V-Groove Trench MOSFET", National Institute of Advanced Industrial Science and Technology, 2018 IEEE International Electron Devices Meeting, 2018.
Compound Semiconductor International Conference, "Addressing Production of SiC Super-junction MOSFETs", Apr. 18, 2019, <https://compoundsemiconductor.net/article/106962/Addressing_production_of_SiC_super-junction_MOSFETs/feature>.

* cited by examiner

*Primary Examiner* — Cuong B Nguyen
(74) *Attorney, Agent, or Firm* — NIELDS, LEMACK & FRAME, LLC

(57) ABSTRACT

Methods for fabricating SiC MOSFETs using channeled ion implants are disclosed. By aligning the workpiece such that the ions pass through channels in the SiC hexagonal crystalline structure, it is possible to achieve deeper implants than are otherwise possible. Further, it was found that these channeled implants can be tailored to achieve box-like dopant concentrations. This allows channeled ion implants to be used to create the current spreading layer of the MOSFET, which is conventional fabricated using epitaxial growth. Further, these channeled implants can also be used to create the shields between adjacent transistors. Additionally, the use of channeled implants allows a reduction in the number of epitaxially growth processes that are used to create super junction MOSFETs.

20 Claims, 10 Drawing Sheets

US 11,804,537 B2

CHANNELED IMPLANTS FOR SIC MOSFET FABRICATION

FIELD

This disclosure describes methods for fabricating SiC MOSFET devices, and more particularly, fabricating trench MOSFETs using channeled implants.

BACKGROUND

Recently, the use of silicon carbide (SiC) as a workpiece for the manufacture of semiconductor devices has grown. Various geometries are being explored to produce high voltage devices with low on-resistance.

Among these devices are trench MOSFETs and super junction MOSFETs. A trench MOSFET is typically created using epitaxial growth, which may also simultaneously dope the device. For example, the drift region of the MOSFET may be created using epitaxial growth, such as through the use of Chemical Vapor Deposition, where in addition to silicon and carbon, an n-type dopant is also introduced. After completion of the drift region, the current spread layer is then formed, again using epitaxial growth with an increased amount of n-type dopant. Following the formation of the current spreading layer, another epitaxial growth process is performed to add the remaining material. This material is then processed using ion implantation and etching processes to create source areas, p-wells and the trenches.

The fabrication of super junction MOSFETs may be more complex than that described above. Specifically, the creation of p- and n-doped pillars is achieved through multiple sequential ion implantation and epitaxial growth processes. Consequently, the thickness of the material added by the epitaxial growth process is less than the depth that can be achieved by an ion implant process. Since there is limited diffusion within a SiC workpiece, the thickness of each epitaxial layer may be limited to 1 μm or less. Again, epitaxial growth is a time consuming process, which reduces throughput and total capacity.

Therefore, it would be beneficial if there were a method of fabricating these devices that utilized fewer epitaxial growth processes. Further, it would be advantageous if this method was applicable to a variety of different types of devices.

SUMMARY

Methods for fabricating SiC MOSFETs using channeled ion implants are disclosed. By aligning the workpiece such that the ions pass through channels in the SiC hexagonal crystalline structure, it is possible to achieve deeper implants than are otherwise possible. Further, it was found that these channeled implants can be tailored to achieve box-like dopant concentrations. This allows channeled ion implants to be used to create the current spreading layer of the MOSFET, which is conventional fabricated using epitaxial growth. Further, these channeled implants can also be used to create the shields between adjacent transistors. Additionally, the use of channeled implants allows a reduction in the number of epitaxially growth processes that are used to create super junction MOSFETs.

According to one embodiment, a method of fabricating a silicon carbide trench MOSFET is disclosed. The method comprises using a channeled implant to create a current spreading layer within a silicon carbide workpiece, wherein the current spreading layer has a thickness greater than 800 nanometers; implanting p-type ions into a region of the silicon carbide workpiece that is shallower than the current spreading layer to form a p-well; implanting n-type ions into a source area of the silicon carbide workpiece, wherein the source area is disposed above the p-well; and creating a trench that extends through the source area, the p-well and optionally a portion of the current spreading layer. In certain embodiments, a concentration profile throughout a thickness of the current spreading layer varies by a factor of 5 or less. In some embodiments, the concentration profile throughout the thickness of the current spreading layer varies by a factor of 2 or less. In certain embodiments, the channeled implant is performed at a non-zero tilt angle. In some embodiments, the channeled implant is performed at an angle within ±2° of a direction of a main crystallographic direction. In certain embodiments, the channeled implant is performed at an angle within ±1° of a direction of a main crystallographic direction. In some embodiments, the channeled implant is performed at a non-zero twist angle. In some embodiments, a single implant process is performed to create the current spreading layer. In some embodiments, the current spreading layer extends to a depth of at least 1500 nanometers.

According to another embodiment, method of fabricating a doped pillar for use in a SiC super junction MOSFET is disclosed. The method comprises epitaxially growing at least 3 μm of SiC material; implanting ions into a portion of the SiC material using a channeled implant to create a nearly uniform dopant concentration throughout the at least 3 μm of SiC material so that a portion of the doped pillar is created; and repeating the epitaxially growing and implanting until a desired thickness of the doped pillar is achieved. In certain embodiments, the channeled implant is performed at a non-zero tilt angle. In some embodiments, the channeled implant is performed at an angle within ±2° of a direction of a main crystallographic direction. In certain embodiments, the channeled implant is performed at an angle within ±1° of a direction of a main crystallographic direction. In some embodiments, the method further comprises performing a random implant after the epitaxial growing to increase a dopant concentration near a top surface of the SiC material.

According to another embodiment, a method of fabricating a SiC super junction MOSFET is disclosed. The method comprises fabricating a drift region with p-doped pillars using channeled implants so as to reduce a number of epitaxial growth processes that are performed as compared to using random implants; epitaxially growing SiC material on top of the drift region with p-doped pillars; fabricating a current spreading layer by implanting n-type ions into the SiC material that was epitaxially grown; forming a p-well and source area on top of the current spreading layer; and forming a trench that extends through a thickness of the p-well and source area. In some embodiments, the number of epitaxial growth processes that are performed is less than half a number of epitaxial growth processes that are performed using a random implant. In certain embodiments, the number of epitaxial growth processes that are performed is less than third the number of epitaxial growth processes that are performed using a random implant. In some embodiments, at least one of the epitaxial growth processes grows at least 2 μm of SiC material. In certain embodiments, the current spreading layer is fabricated using a channeled implant. In certain embodiments, a thickness of the current spreading layer is at least 800 nanometers.

BRIEF DESCRIPTION OF THE FIGURES

For a better understanding of the present disclosure, reference is made to the accompanying drawings, which are incorporated herein by reference and in which.

DETAILED DESCRIPTION

The present disclosure describes the use of channeled implants to enable the formation of vertical trench transistors and other devices. This technique is applicable to various types of semiconductor process apparatus. Several of these apparatuses are described below.

Figure 1A:
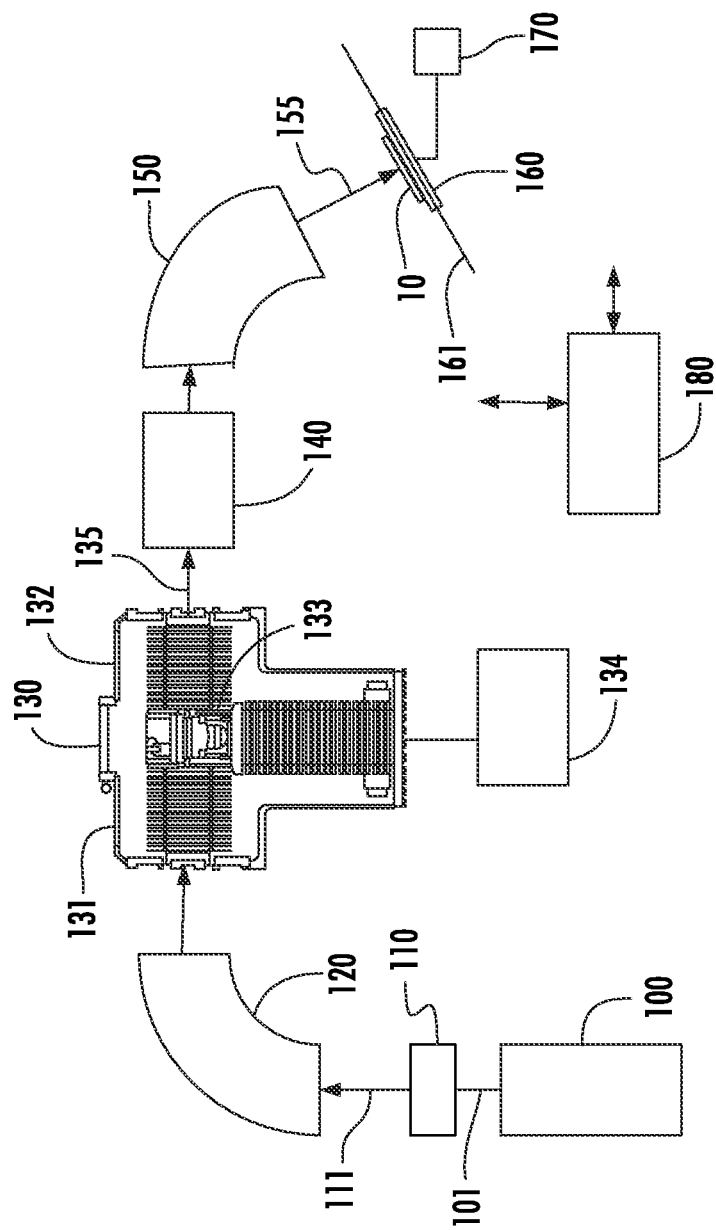
FIG. 1A shows a semiconductor processing apparatus that may be utilized according to one embodiment.

As shown in FIG. 1A, a semiconductor processing apparatus comprises an ion source 100, which is used to generate an ion beam. In one embodiment, a positive ion beam 101 may be created in the traditional manner, such as using a Bernas or indirectly heated cathode (IHC) ion source. Of course, other types of ion sources may also be employed. A feedgas is supplied to the ion source 100, which is then energized to generate ions. In certain embodiments, the feedgas may be hydrogen, boron, phosphorus, arsenic, aluminum, helium, or other suitable species. Extraction optics are then used to extract these ions from the ion source 100.

The positive ion beam 101 exiting the ion source 100 may be coupled to a Mg charge exchange cell 110, which transforms the positive ion beam 101 into a negative ion beam 111. Of course, other mechanisms for the generation of a negative ion beam are known in the art. The mechanism used to create the negative ion beam is not limited by this disclosure.

The negative ion beam 111 may be directed toward a mass analyzer 120, which only allows the passage of certain species of ions. The negative ions that exit the mass analyzer 120 are directed toward a tandem accelerator 130.

The tandem accelerator 130 has two pathways, which are separated by a stripper tube 133. The input pathway 131 comprises a plurality of input electrodes. These input electrodes may be any suitable electrically conductive material, such as titanium or other metals. The outermost input electrode may be grounded. Each of the subsequent input electrodes may be biased at an increasingly more positive voltage moving closer to the stripper tube 133.

The input pathway 131 leads to the stripper tube 133. The stripper tube 133 is biased positively relative to the outermost input electrode. The stripper tube 133 includes an injection conduit where a stripper gas is injected. The stripper gas may comprise neutral molecules. These neutral molecules may be any suitable species such as, but not limited to argon and nitrogen. The stripper tube 133 has an inlet disposed on the same side as the input pathway 131. The outlet of the stripper tube 133 is in communication with the output pathway 132.

In other words, the stripper tube 133 is positively biased so as to attract the negative ion beam 111 through the input pathway 131. The stripper tube 133 removes electrons from the incoming ions, transforming them from negative ions into positive ions.

The stripper tube 133 is more positive than the electrodes in the output pathway 132. Each subsequent output electrode may be less positively biased moving away from the stripper tube 133. For example, the outermost output electrode may be grounded. Thus, the positive ions in the stripper tube 133 are accelerated through the output pathway 132.

In this way, the ions are accelerated two times. First, negative ions are accelerated through the input pathway 131 to the stripper tube 133. This acceleration is based on the difference between the voltage of the outermost input electrode and the voltage of the stripper tube 133. Next, positive ions are accelerated through the output pathway 132. This acceleration is based on the difference between the voltage of the stripper tube 133 and the voltage of the outermost output electrode in the output pathway 132.

An accelerator power supply 134 may be used to supply the voltages to the stripper tube 133, as well as the electrodes in the input pathway 131 and the output pathway 132. The accelerator power supply 134 may be capable of supply a voltage up to 2.5MV, although other voltages, either higher or lower, are also possible. Thus, to modify the implant energy, the voltage applied by the accelerator power supply 134 is changed.

After exiting the tandem accelerator 130, the positive ion beam 135 may enter a filter magnet 140, which allows passage of ions of only a certain charge. In other embodiments, the filter magnet 140 may not be employed. The output of the filter magnet 140 may pass through a scanner 150, which serves to create the final ion beam 155 containing the desired species of ions. The scanner 150 causes the incoming ion beam to be fanned in the width direction so as to form a scanned ribbon ion beam. The output of the scanner 150 is then directed toward a platen 160. A workpiece 10 may be disposed on the platen 160. In certain embodiments, a corrector magnet may be disposed between the scanner 150 and the platen 160.

The platen 160 may be in communication with a platen orientation motor 170. The platen orientation motor 170 may be configured to move the platen 160 in any of a plurality of different directions. For example, the platen orientation motor 170 may have the capability to rotate the platen 160. Rotation occurs about an axis that is normal to the surface of the platen 160 and passes through the center of the workpiece (or platen). The angle of rotation may be referred to as the twist angle.

Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

Additionally, the semiconductor processing apparatus includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the accelerator power supply 134, so as to control the implant energy. In addition, the controller 180 may be in communication with the platen orientation motor 170, so as to adjust the tilt angle and twist angle of the platen 160. The controller 180 may also be in communication with other components.

Figure 1B:
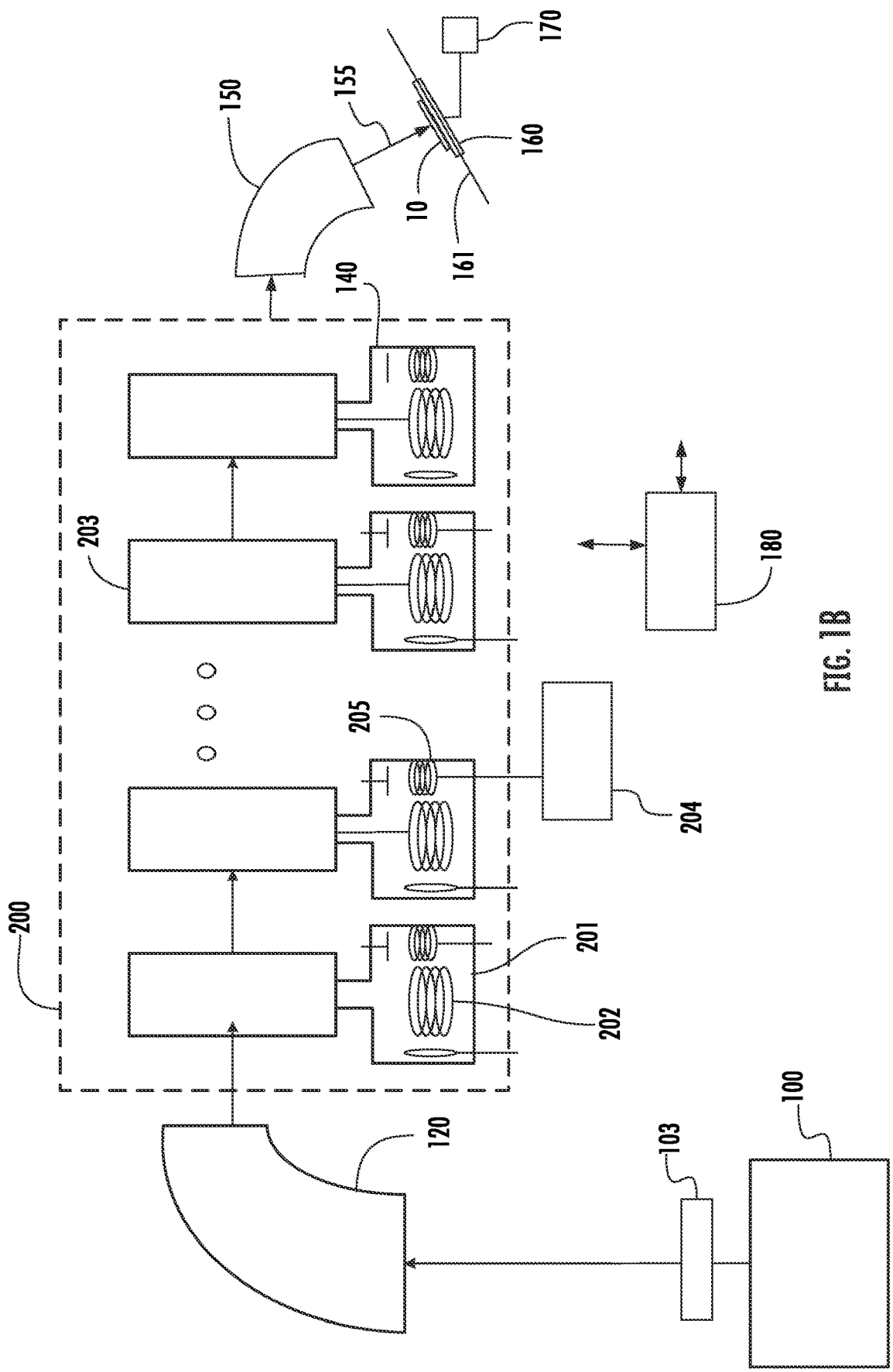
FIG. 1B shows a semiconductor processing apparatus that may be utilized according to a second embodiment.

A second embodiment is shown in FIG. 1B. Components that are common with FIG. 1A are given identical reference designators.

As described above, a semiconductor processing apparatus comprises an ion source 100, which is used to generate an ion beam. The ion source 100 has an aperture through which ions may be extracted from the ion source 100. These ions may be extracted from the ion source 100 by applying a negative voltage to the extraction optics 103 disposed outside the ion source 100, proximate the extraction aperture. The extraction optics 103 may be pulsed so that ions exit at specific times. The group of ions that exits may be referred to as a bunch. In one embodiment, a plurality of bunched ions may be created. The ions may then enter a mass analyzer 120, which may be a magnet that allows ions having a particular mass to charge ratio to pass through. This mass analyzer 120 is used to separate only the desired ions. It is the desired ions that then enter the linear accelerator 200.

The linear accelerator 200 comprises one or more cavities 201. Each cavity 201 comprises a resonator coil 202 that may be energized by electromagnetic fields created by an excitation coil 205. The excitation coil 205 is disposed in the cavity 201 with a respective resonator coil 202. The excitation coil 205 is energized by an excitation voltage, which may be a RF signal. The excitation voltage may be supplied by a respective RF generator 204. In other words, the excitation voltage applied to each excitation coil 205 may be independent of the excitation voltage supplied to any other excitation coil 205. Each excitation voltage is preferably modulated at the resonance frequency of its respective cavity 201.

When an excitation voltage is applied to the excitation coil 205, a voltage is induced on the resonator coil 202. The result is that the resonator coil 202 in each cavity 201 is driven by a sinusoidal voltage. Each resonator coil 202 may be in electrical communication with a respective accelerator electrode 203. The ions pass through apertures in each accelerator electrode 203.

The entry of the bunch into a particular accelerator electrode 203 is timed such that the potential of the accelerator electrode 203 is negative as the bunch approaches, but switches to positive as the bunch passes through the accelerator electrode 203. In this way, the bunch is accelerated as it enters the accelerator electrode 203 and is repelled as it exits. This results in an acceleration of the bunch. This process is repeated for each accelerator electrode 203 in the linear accelerator 200. Each accelerator electrode 203 increases the acceleration of the ions.

After the bunch exits the linear accelerator 200, the bunch may pass through a scanner 150, which serve to create the final ion beam 155 containing the desired species of ions. The scanner 150 causes the incoming ion beam to be fanned in the width direction so as to form a scanned ribbon ion beam.

As described above, the platen 160 may be in communication with a platen orientation motor 170. The platen orientation motor 170 may be configured to move the platen 160 in any of a plurality of different directions. For example, the platen orientation motor 170 may have the capability to rotate the platen 160. Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

The controller 180 may be in communication with the RF generator 204, so as to control the implant energy. In addition, the controller 180 may be in communication with the platen orientation motor 170, so as to adjust the tilt angle and twist angle of the platen 160. The controller 180 may also be in communication with other components, such as the RF generators 204.

Of course, the ion implantation system may include other components, such as quadrupole elements, additional electrodes to accelerate or decelerate the beam and other elements.

Figure 1C:
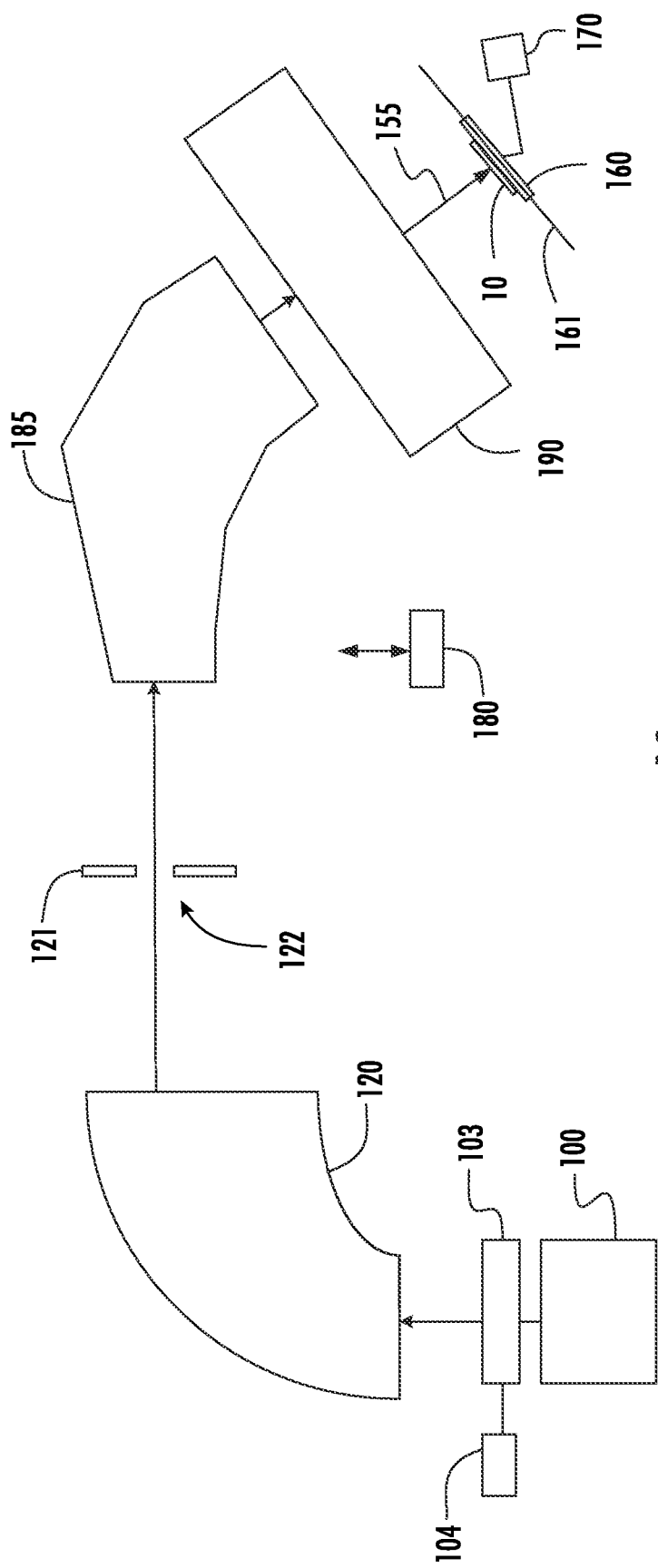
FIG. 1C shows a semiconductor processing apparatus that may be utilized according to a third embodiment.

A third embodiment is shown in FIG. 1C. Components that are common with FIG. 1A are given identical reference designators.

The semiconductor processing apparatus includes an ion source 100. In certain embodiments, the ion source 100 may be an RF ion source. In another embodiment, the ion source 100 may be an indirectly heated cathode (IHC). Other embodiments are also possible. For example, the plasma may be generated in a different manner, such as by a Bernas ion source, a capacitively coupled plasma (CCP) source, microwave or ECR (electron-cyclotron-resonance) ion source. The manner in which the ions is generated is not limited by this disclosure.

One chamber wall, referred to as the extraction plate, includes an extraction aperture. The extraction aperture may be an opening through which the ions generated in the ion source chamber are extracted and directed toward a workpiece 10. The extraction aperture may be any suitable shape. In certain embodiments, the extraction aperture may be oval or rectangular shaped, having one dimension, referred to as the width (x-dimension), which may be much larger than the second dimension, referred to as the height (y-dimension). In certain embodiments, a ribbon ion beam is extracted from the ion source 100. In other embodiments, a spot ion beam is extracted from the ion source 100.

Disposed outside and proximate the extraction aperture of the ion source 100 are extraction optics 103. In certain embodiments, the extraction optics 103 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an extraction power supply 104. The extraction power supply 104 may be used to bias one or more of the electrodes relative to the ion source 100 so as to attract ions through the extraction aperture. The voltage applied by the extraction power supply 104 to the extraction optics 103 may determine the energy of the extracted ions.

Located downstream from the extraction optics 103 is a mass analyzer 120. The mass analyzer 120 uses magnetic fields to guide the path of the extracted ions. The magnetic fields affect the flight path of ions according to their mass and charge. A mass resolving device 121 that has a resolving aperture 122 is disposed at the output, or distal end, of the mass analyzer 120.

By proper selection of the magnetic fields, only those ions that have a selected mass and charge will be directed through the resolving aperture 122. Other ions will strike the mass resolving device 121 or a wall of the mass analyzer 120 and will not travel any further in the system.

A collimator 185 is disposed downstream from the mass resolving device 121. The collimator 185 accepts the ions that pass through the resolving aperture 122 and creates a ribbon ion beam formed of a plurality of parallel or nearly parallel beamlets.

Located downstream from the collimator 185 may be an acceleration/deceleration stage 190. The acceleration/deceleration stage 190 may be referred to as an energy purity module. The energy purity module is a beam-line lens component configured to independently control deflection, acceleration, deceleration, and focus of the ion beam. For example, the energy purity module may be a vertical electrostatic energy filter (VEEF) or electrostatic filter (EF).

In certain embodiments, quadrupole lenses may be disposed in certain positions in the semiconductor processing apparatus. For example, a quadrupole lens may be disposed between the ion source 100 and the mass analyzer 120, between the mass analyzer 120 and the mass resolving device 121, and/or between the mass resolving device 121 and the collimator.

Of course, the ion implantation system may include other components, such as a scanner to create a ribbon beam from a spot ion beam, and additional electrodes to accelerate or decelerate the beam and other elements.

Thus, in this embodiment, the extraction optics 103 and/or the acceleration/deceleration stage 190 may be referred to as an accelerator, as these components are used to accelerate the ions to the desired implant energy.

The final ion beam 155 exits the acceleration/deceleration stage 190 and impacts the workpiece 10 disposed on the platen 160. The platen 160 may be in communication with a platen orientation motor 170. The platen orientation motor 170 may be configured to move the platen 160 in any of a plurality of different directions. For example, the platen orientation motor 170 may have the capability to rotate the platen 160. Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

Additionally, the semiconductor processing apparatus includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the extraction power supply 104 and other components, so as to control the implant energy. In addition, the controller 180 may be in communication with the platen orientation motor 170, so as to adjust the tilt angle and twist angle of the platen 160.

Thus, FIGS. 1A, 1B and 1C all show a semiconductor processing apparatus that includes an ion source 100, a mass analyzer 120, an accelerator, a platen 160, a controller 180 and a platen orientation motor 170.

For each implant, there may be an associated recipe, which includes the voltage applied to the accelerator, the dose, and the tilt and twist angles to be supplied by the platen orientation motor 170.

In operation, a workpiece 10 is disposed on the platen 160 and is implanted by the final ion beam 155. The workpiece 10 may be a silicon carbide (SiC) workpiece. The controller 180 may set the tilt and twist angles to be supplied by the platen orientation motor 170 prior to the implantation. Additionally, the controller 180 may set the voltage to be applied to the accelerator and the dose to be implanted.

Any of the semiconductor processing apparatus described above may be used to perform a series of implants so as to form the SiC MOSFETs described below.

The workpiece used to create the transistor is made of single-crystalline silicon carbide. Various poly-types of silicon carbide exist, the most common ones being 3C-SiC, which has a cubic crystal lattice structure, and 4H-SiC and 6H-SiC, which have a hexagonal crystal lattice structure. The single crystal SiC can be oriented and polished to present a major crystallographic plane as its surface. Most common is the "Si-Face", the (0001) plane with a Si-termination. Others include (11$\bar{2}$0) "A-Face", or (1$\bar{1}$00) "M-Face". Typically, the (0001) plane is miscut by 4°, that is, the surface normal makes an angle of 4° with the [0001] direction.

A major crystallographic plane has major crystallographic directions ("channels"), such as [0001] or [11$\bar{2}$3] on the (0001) plane, or [11$\bar{2}$0] on the (11$\bar{2}$0) plane. Each such direction has a different degree of "openness", increasing from [0001] to [11$\bar{2}$3] to [11$\bar{2}$0]. Hence, in certain embodiments, the [11$\bar{2}$0] direction may be best for channeling due to its openness. When implants of equal implant energy are performed aligned along each of these directions, the depth of the implant is the deepest when the beam is aligned with the [11$\bar{2}$0] direction. Thus, in the following description, in certain embodiments, the SiC workpiece comprises 4H-SiC Si-face crystal, wherein the (0001) face is the top surface The workpiece may have a 4.0° miscut. Further, the effects of channeling may be adjusted by tuning the tilt and/or twist angles.

Figure 2A:
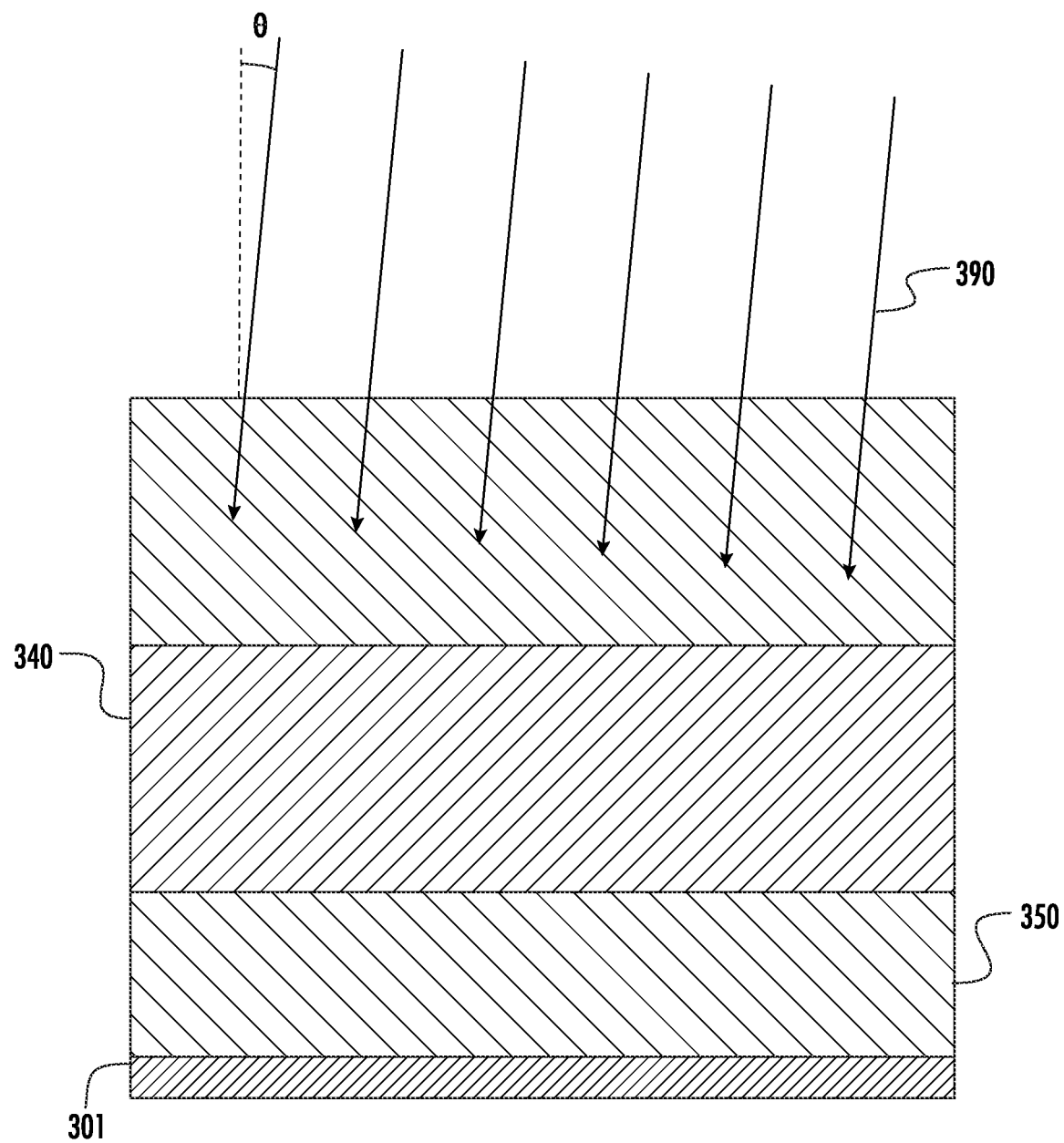
FIGS. 2A-2E show fabrication processes for forming a SiC trench MOSFET.
Figure 2B:
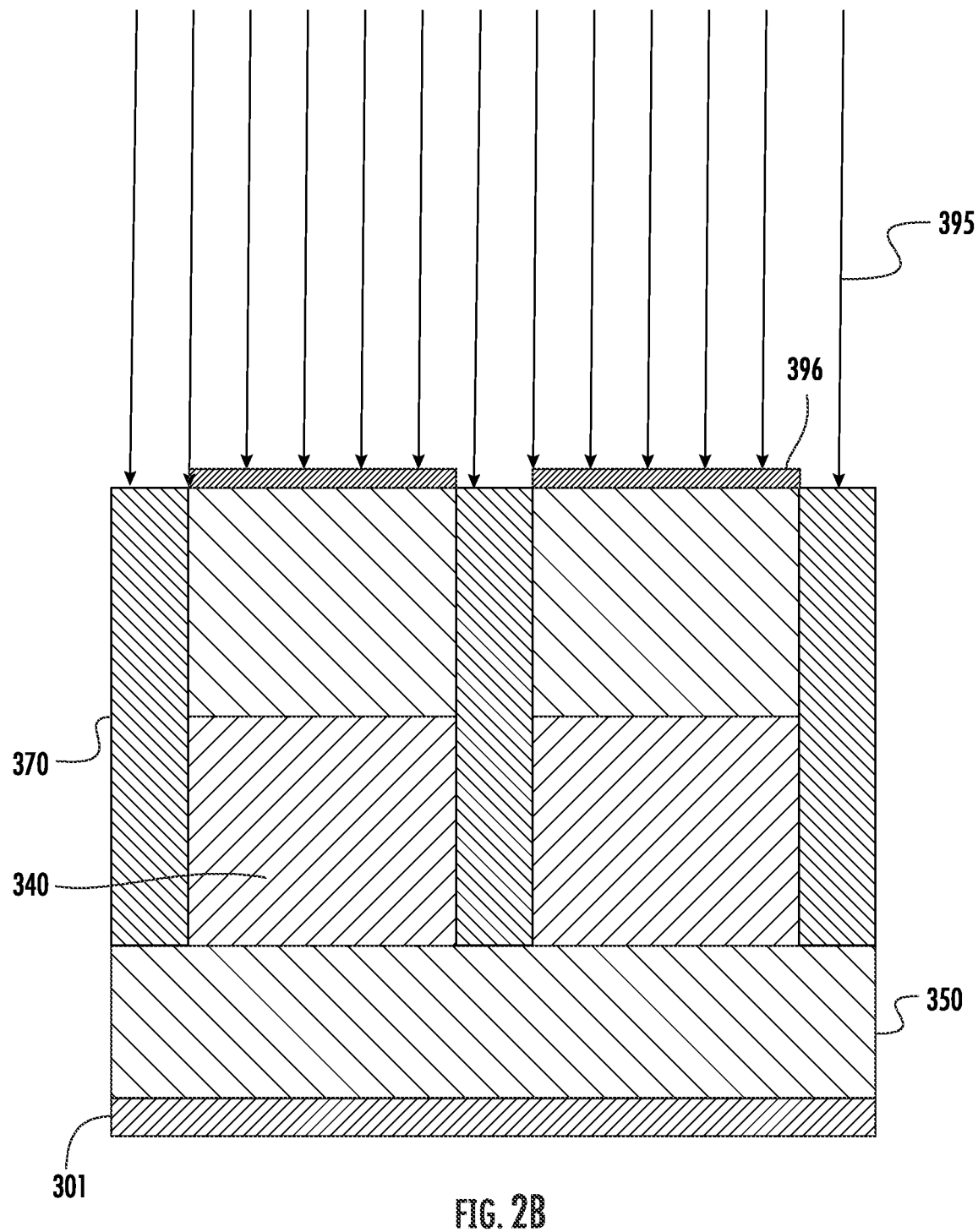
Figure 2C:
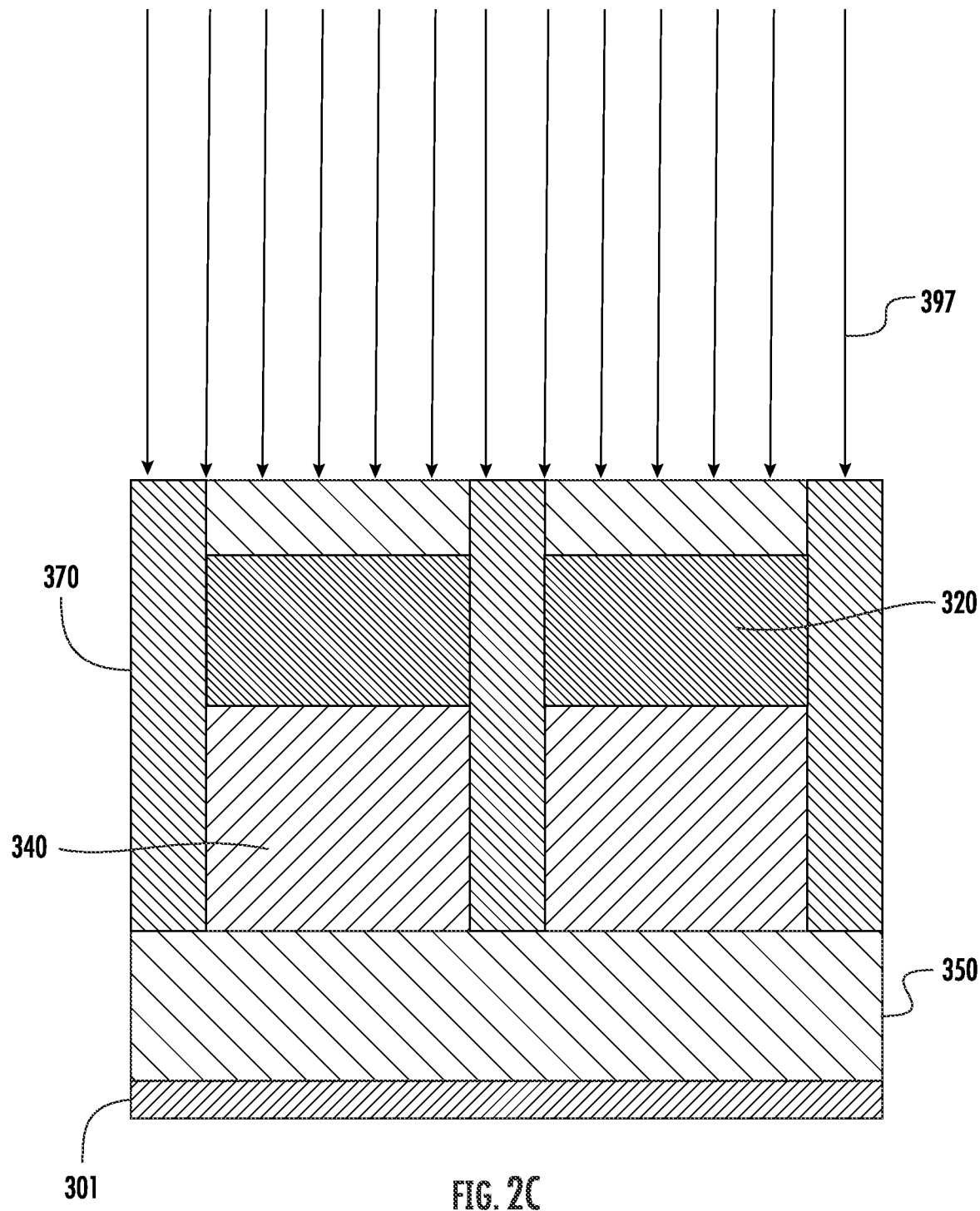
Figure 2D:
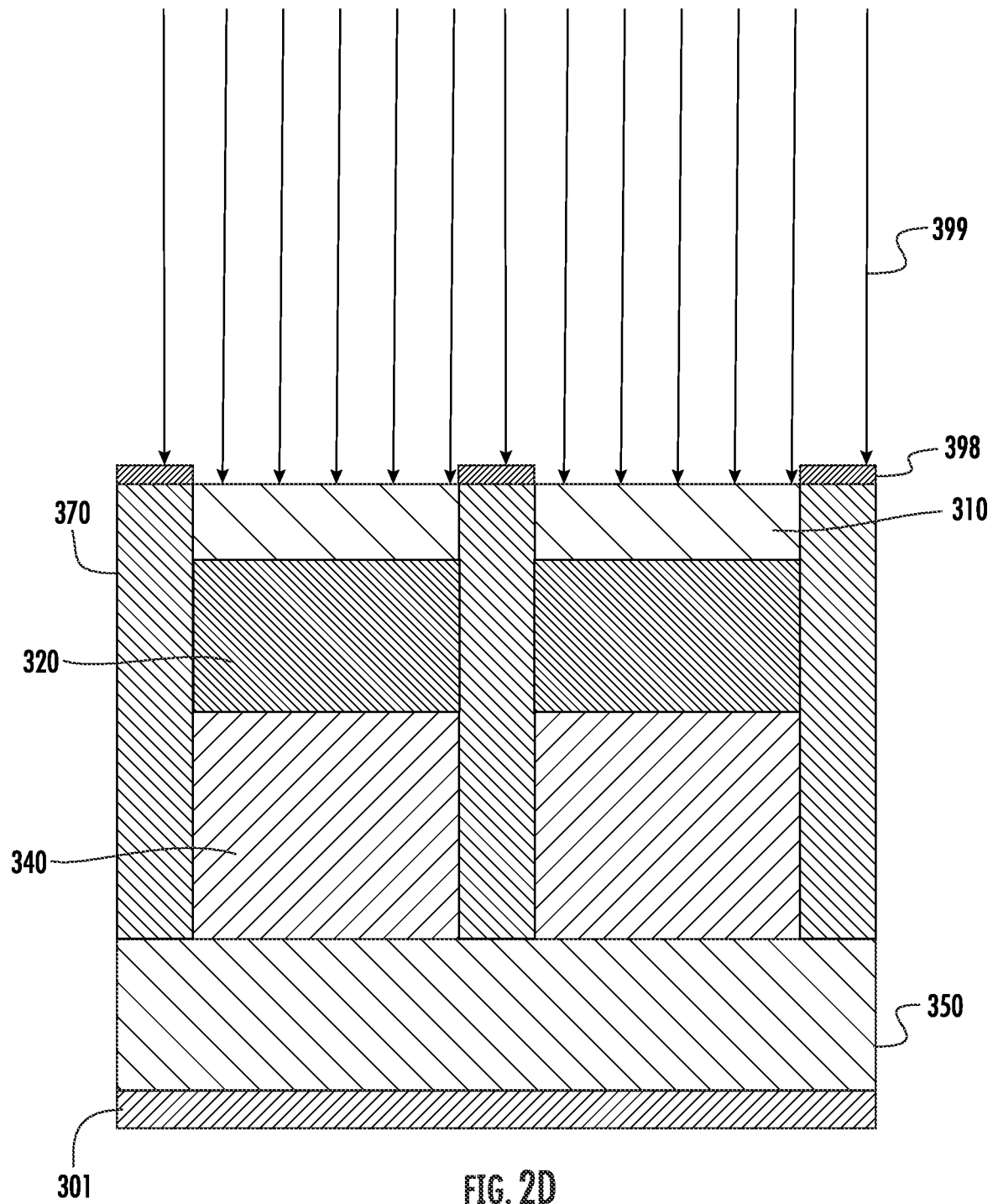
Figure 2E:
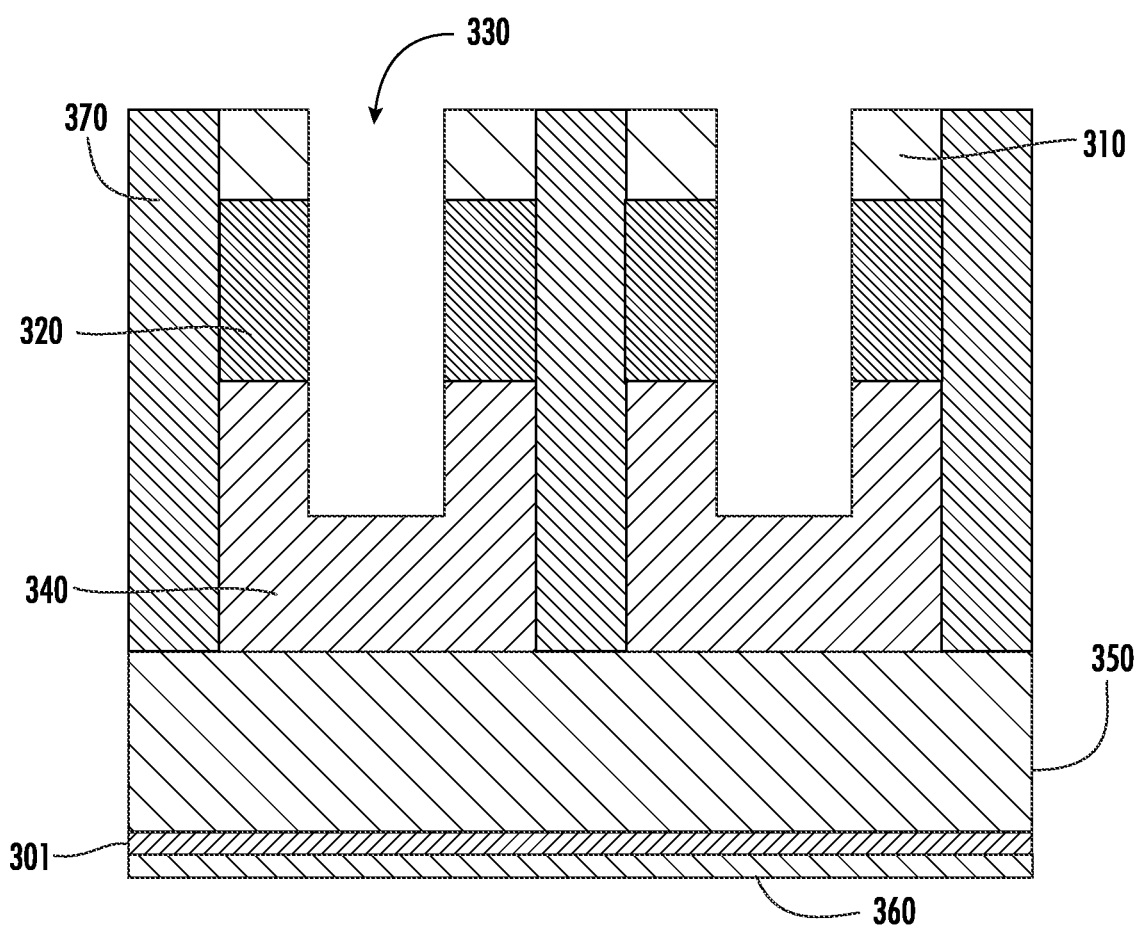

FIGS. 2A-2E show one example of a sequence that may be used to fabricate the SiC trench MOSFET. FIG. 2E shows the SiC trench MOSFET 300 after several of the fabrication processes have been completed. Note that the figure is not to scale. In trench transistors, the source is disposed on one surface of the workpiece, while the drain is disposed on the opposite surface. The gate is located on the same side as the source, and is disposed within a trench.

As noted above, the source areas 310 are located on a top surface of the workpiece. These source areas 310 may be heavily n-doped. The source areas 310 may have a thickness of about 200 nanometers. Beneath the source areas 310 are p-wells 320. These p-wells are p-doped. The p-wells 320 may have a thickness of about 500 nanometers. Note that the trench 330 extends completely through the source areas 310 and p-wells 320. In other words, the depth of the trench 330 is more than 700 nanometers. In certain embodiments, the trench 330 may have a depth that is equal to or greater than 1.5 μm. In certain embodiments, the depth of the trench 330 may be up to 2.5 μm or more. In certain embodiments, an oxide layer (not shown) may be disposed along the sidewalls of the trench 330. The oxide layer may be grown by annealing in oxygen. Although not shown, the gate is later formed in the trench 330.

Beneath the p-wells 320 is a current spreading layer (CSL) 340. The current spreading layer 340 may extend from the bottom of the p-wells 320 to beyond the depth of the trench 330 or the shield 370. Thus, the current spreading layer 340 may have a thickness of 0.8 μm to over 2.0 μm. Further, the current spreading layer 340 may extend to a depth of between 1.5 µm to over 2.7 µm. The current spreading layer 340 is used to collect the current that passes through either side of the trench 330 and distribute the current more evenly as it travels through the drift region 350 toward the drain area 360. The current spreading layer 340 may be n-doped, but the concentration may be less than is used for the source areas 310. Ideally, concentration of n-type dopant is nearly constant throughout the current spreading layer 340.

Drift region 350 is disposed beneath the current spreading layer 340, and may be very lightly n-doped. In certain embodiments, the drift region 350 may be 9 µm or more. This light doping may be created during the epitaxial growth process.

Each of the regions described above are typically created via epitaxial growth on top of the SiC substrate 301.

Finally, at the bottom of the SiC workpiece is a drain area 360. The drain area 360 is heavily n-doped. The source area 310 and drain area 360 may be metallized to create contacts (not shown).

Further, in certain embodiments, it may be desirable to electrically shield the bottom corner of the trench 330. Thus, in certain embodiments, a shield 370 may be disposed between adjacent transistors. In certain embodiments, the shield 370 may extend to a depth that is at least equal to the depth of the trench 330. The shield 370 may be heavily p-doped. In certain embodiments, concentration of p-type dopant may be lower in the region below the p-well 320 to avoid pinch-off of the current spreading layer 340 and higher in the region adjacent to the p-well 320 to allow better contact. The doping profile in each region may be nearly constant.

One example of a sequence that may be used to fabricate the SiC trench MOSFET 300 is described below. First, a silicon carbide workpiece is provided. In certain embodiments, at least a portion of the SiC workpiece is created using epitaxial growth. For example, a chemical vapor deposition (CVD) process may be used to grow the upper portion of the SiC workpiece on top of the SiC substrate 301. The SiC substrate 301 may be a 4-H SIC crystal with a miscut of 1 or more degrees. The SiC substrate 301 may be a Si-Face crystal in some embodiments. In certain embodiments, the miscut is 4.0°. The miscut may encourage the epitaxially grown SiC to have the same poly-type and orientation as the SiC substrate 301. This epitaxially grown portion may be in-situ n-type doped. In this way, the drift region 350, which is n-doped, is formed. The thickness of this upper portion of the SiC workpiece may be in excess of 10-15 µm for a 1200V devices. In certain embodiments, this epitaxial grown portion includes all material disposed above the SiC substrate 301. The thickness may vary proportionally for other voltage grades. Next, after forming the SiC workpiece, the current spreading layer 340 may be created using ion implantation of a first species 390, as shown in FIG. 2A. The first species 390 may be a n-type dopant, such as phosphorus.

It has been found that an ion implant that takes advantage of channeling in the SiC workpiece may be used to create a concentration profile that is nearly constant throughout the thickness of the current spreading layer 340. In one embodiment, an ion implant of phosphorus is performed, using a tilt angle and a twist angle that allows for channeling in the workpiece. Tilt angle refers to the angle between the implant and a direction perpendicular to the surface of the SiC workpiece and is labelled as θ in FIG. 2A. In one embodiment, a tilt angle between 3° and 5° is used, along with a twist angle between 80° and 100°. These angles assume a 4° miscut. Stated differently, the tilt angle may be offset by ±1° relative to the direction of a main crystallographic direction. In other embodiments, the tilt angle may be offset by ±2° relative to the direction of a main crystallographic direction Of course, if the surface of the workpiece is oriented differently, these values may be modified accordingly.

Figure 3:
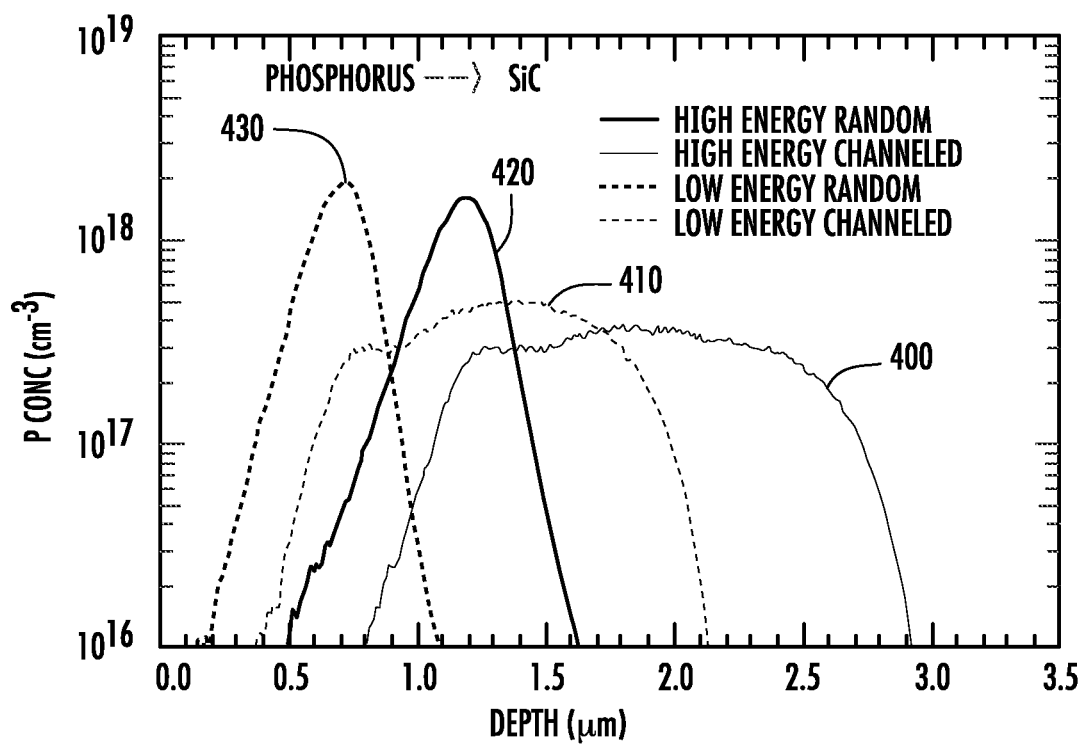
FIG. 3 shows the effect of implant energy, tilt angle and twist angle on concentration profile for phosphorus.

FIG. 3 shows the effects of channeling phosphorus, which were obtained via simulation. This simulation was performed assuming a 4-H SiC crystal with a (0001) face and a miscut of 4.0°. In certain embodiments, an ion implant using a tilt angle between 3.5° and 4.5° and a twist angle of 90° was used to create a concentration profile 400 that varied by less than a factor of 2 from a depth of 1200 nanometers to a depth of 2700 nanometers. In other words, the concentration profile 400 is box-like in this range. Note that this concentration profile can be shifted left or right (i.e. shallower or deeper) by changing the implant energy that is used. For example, by roughly halving the implant energy, the concentration profile 410 moves to depths between 700 nanometers and 1900 nanometers.

Note that the use of channeling has two benefits. Concentration profile 420 results from an implant that does not utilize channeling and uses the same energy as concentration profile 400. An implant that does not utilize channeling may be referred to as a random implant. Note that the depth of the random implantation is much shallower. Further, note that the concentration profile 420 has a much narrower peak. In fact, the concentration varies by more than an order of magnitude within 600 nanometers. A similar result is shown in concentration profile 430, which uses the same energy as concentration profile 410 but does not utilize channeling. Thus, the use of channeled implants allows concentration profiles that are advantageous for any structure that utilizes a box profile. Throughout this disclosure, the term "channeled implant" denotes an implant that is performed at an angle that is within ±2° of the direction of a main crystallographic direction in the workpiece. In certain embodiments, the channeled implant may be within ±1° of the direction of a main crystallographic direction in the workpiece.

Thus, the entirety of a region having a thickness of 3 nanometers can be implanted at once using a channeled implant. In contrast, to create this region using random implants, two or three epitaxial growth processes are performed, where a random implant is done following each growth process.

Note that the current spreading layer 340 is formed after the material that will become the p-well 320 and the source area 310 has already been grown. In other words, the current spreading layer 340 is disposed beneath the top surface after the channeled implant is performed. In some embodiments, the current spreading layer 340 may be at least 0.7 µm beneath the top surface of the SiC workpiece after the channeled implant is completed, as shown in FIG. 2A.

Thus, as shown in FIG. 3, by performing a channeled implant using an appropriate implant energy, a box-like profile having a concentration between about 2E17 and 4E17 may be created in the SiC workpiece at a depth between 1100 nanometers and 2800 nanometers. The concentration profile may be further tuned through tilt and twist optimization. Thus, in certain embodiments, the concentration of the current spreading layer 340 may vary by less than a factor of 5 throughout its thickness. In certain embodiments, the concentration of the current spreading layer 340 may vary by less than a factor of 3 throughout its thickness. In certain embodiments, the concentration of the current spreading layer 340 may vary by less than a factor of 2 throughout its thickness. Variation in the implant energy may vary the depth of this implant. Changes in dose may change the peak concentration. Note that this box-like profile was created using a single implant process. Thus, in certain embodiments, the current spreading layer 340 is created using a single implant process that utilizes channeling. In other embodiments, two or more channeled implants may be used to create the current spreading layer, depending on the desired thickness of the current spreading layer 340.

Next, as shown in FIG. 2B, the shield 370 may be formed. In certain embodiments, the shield 370 is formed using p-type dopant. Thus, in one embodiment, a mask 396 may be disposed on the surface of the workpiece, such that only areas where the shield 370 is to be created are exposed. A channeled implant using a second species 395 is then performed. In certain embodiments, the channeled implant may be performed with a non-zero tilt angle. As noted above, this second species 395 may be a p-type dopant, such as aluminum.

Figure 4:
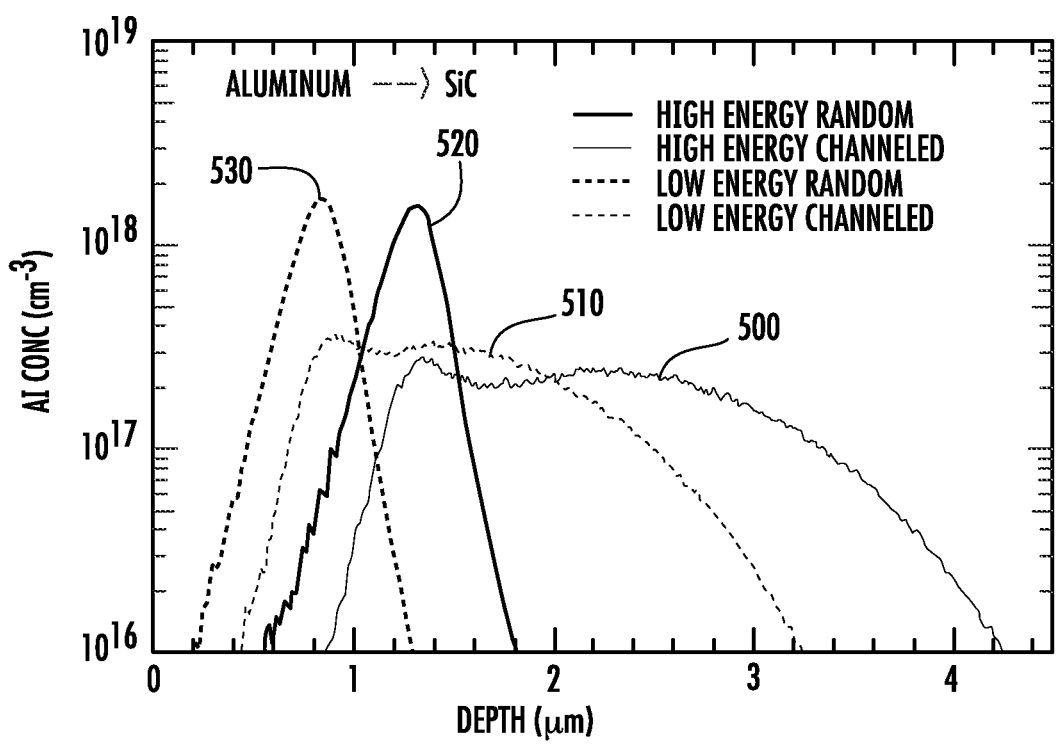
FIG. 4 shows the effect of implant energy, tilt angle and twist angle on concentration profile for aluminum.

FIG. 4 shows the effects of channeling aluminum ions, which was obtained via simulation. This simulation was performed assuming a 4-H SiC crystal with a (0001) face and a miscut of 4.0°. In certain embodiments, an ion implant using a tilt angle of the ion beam with respect to the [0001] crystallographic direction between −0.5° and 0.5 was used to create a concentration profile 500 that varied by less than a factor of 3 from 1200 nanometers to 3400 nanometers, as is shown in FIG. 4. The tilt occurred in a plane the surface vector of which is [1100]. Note that this concentration profile can be shifted left or right (i.e. shallower or deeper) by changing the implant energy that is used. For example, by roughly halving the implant energy, the concentration profile 510 moves to between depths of 700 nanometers to 2400 nanometers. In contrast, concentration profile 520 results from a random implant that does not channel and uses the same energy as concentration profile 500. Note that the depth of the random implantation is much more shallow. Further, note that the concentration profile 520 has a much more narrow peak. In fact, the concentration varies by more than an order of magnitude within 600 nanometers. A similar result is shown in concentration profile 530, which uses the same energy as concentration profile 510 but does not utilize channeling. Thus, the use of channeled implants allows concentration profiles that are advantageous for any structure that utilizes a box profile. Variation in the implant energy may vary the depth of this implant. Changes in dose may change the peak concentration.

Note that the shield 370 extends from the surface of the workpiece to a depth that is deeper than the trench 330. Thus, in certain embodiments, the shield 370 may be formed using a plurality of implant processes, where one or more of the plurality of implant processes is a channeled implant. For example, a high energy channeled implant may be used to form the deeper portion of the shield 370. A lower energy implant (either channeled or random) may be used to provide the desired concentration at depths that are shallower than that achieved by the high energy channeled implant. For example, a lower energy random implant, such as that represented by concentration profile 530, may be used with the high energy channeled implant, such as that represented by concentration profile 500, to achieve a nearly uniformly doped shield 370. Of course, more or different implants and energies may be used to create this shield 370.

Further, it is noted that the shield 370 may be formed prior to the formation of the current spreading layer 340.

Next, as shown in FIG. 2C, the p-well 320 may be formed by implanting a third species 397. Note that the third species 397 may be the same as the second species 395, as both are p-type dopants. As described above, the p-wells 320 may by formed at a depth between 200 nanometers and 700 nanometers. Thus, in certain embodiments, a low energy random implant, such as one that results in concentration profile 530, may be used. In other embodiments, a low energy channeled implant by be utilized. In certain embodiments, more than one implant process may be performed.

Next, as shown in FIG. 2D, the source areas 310 may be formed using ion implantation. In certain embodiments, a mask 398 may be disposed on the workpiece so that ions of the fourth species 399 are not implanted in the shield 370. In other embodiments, a mask 398 may not be used. Since these source areas 310 are very shallow, a low energy random implant may be performed. Since the source areas 310 are n-type regions, the fourth species 399 may be the same as the first species 390.

Finally, as shown in FIG. 2E, a trench 330 may be created through source areas 310, the p-wells 320 and optionally into the current spreading layer 340. The trench 330 may be created using conventional techniques, such as etching. A drain area 360 may be added using conventional techniques, such as by an ion implant process.

Note that while FIGS. 2A-2E show a sequence of processes, the disclosure is not limited to this embodiment. For example, the processes may be performed in a different order if desired.

While FIGS. 3-4 assume a specific poly-type and orientation, it is understood that channels exist in other poly-types and orientations. Thus, while the tilt and twist angles may change, the concept of a channeled implant, where the tilt angle is configured to be within ±2° of the direction of a main crystallographic direction in the workpiece. In certain embodiments, the tilt angle for a channeled implant may be configured to be within ±1° of the direction of a main crystallographic direction in the workpiece.

Figure 5:
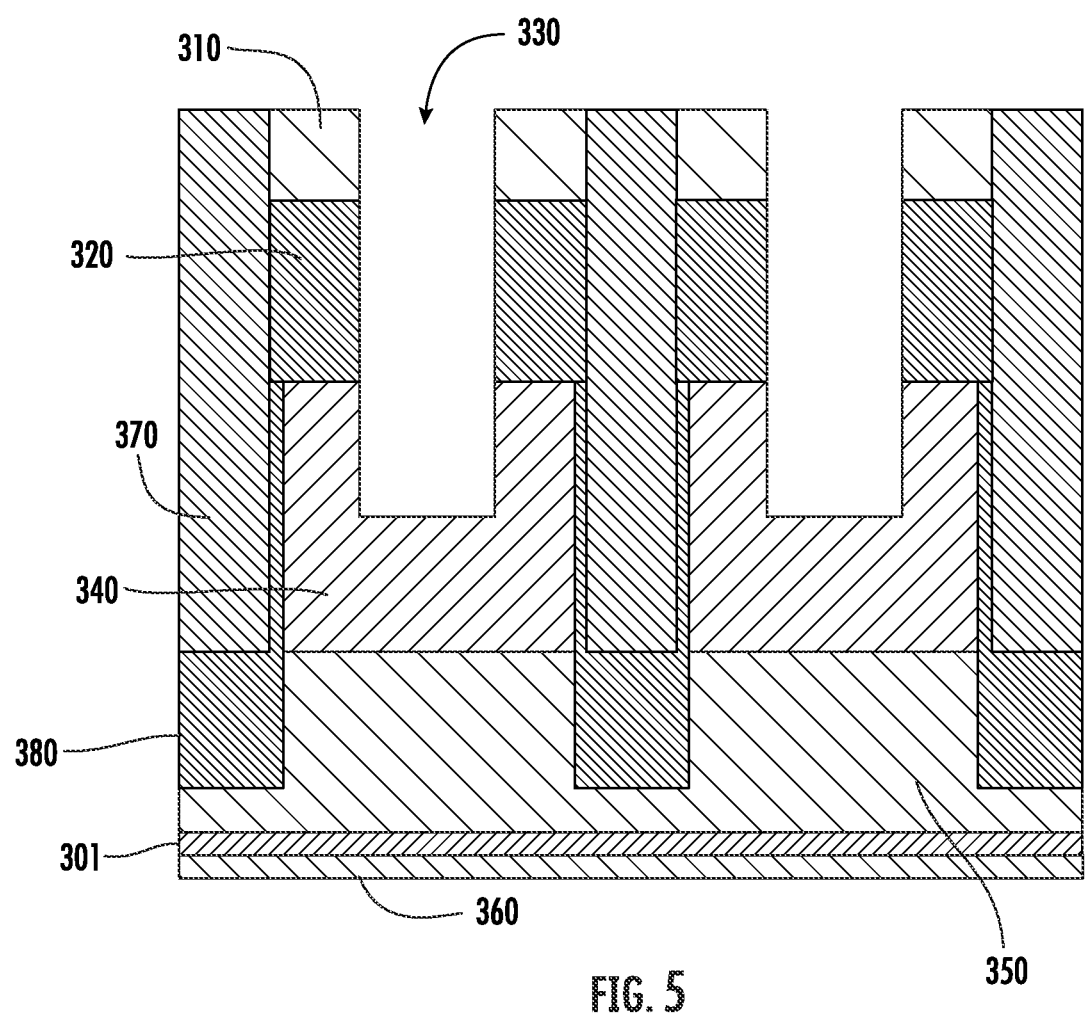
FIG. 5 shows a super junction MOSFET formed using the method described herein.

In addition to the formation of SiC trench MOSFETs, the channeled implants may be used for other applications as well. For example, some transistors are referred to as super junction trench MOSFETs. This device, which is shown in FIG. 5, differs from the SiC trench MOSFET shown in FIG. 2E in that there is a p-doped pillar 380 that extends downward from the shield 370 through at least a portion of the drift region 350. This thickness of this p-doped pillar 380 may be 10 μm or more. The p-doped pillar 380 allows higher doping concentration of the drift region 350, thus enabling low drift resistance. More specifically, super junction trench MOSFETs include both n-type and p-type pillars, so as to attempt to achieve charge neutrality in the drift region 350. If the n-type pillars and p-doped pillars 380 are balanced, the charges may cancel each other in the off state, such that there will be a large breakdown voltage. In the on state, the carriers are free to move, creating a low on-resistance.

Typically, this p-doped pillar 380 is created using the following process. First, a thickness of material is grown on the SiC substrate 301 via epitaxial growth. This newly grown material is then implanted with aluminum ions. The thickness of this grown material is limited by the ability to implant ions into the entire thickness. Therefore, each epitaxial growth process may be limited to roughly 1 μm. Thus, to create a super junction MOSFET having a p-doped pillar of 11 μm may take at least 10 epitaxial growth processes. In contrast, as shown in FIG. 4, a channeled ion implant of aluminum may achieve depths of 4000 nanometers or more. Thus, the same p-doped pillar 380 described above may be formed using only 2 additional epitaxial growth processes.

Thus, in certain embodiments, a method of forming a super junction MOSFET is disclosed. The method includes performing an epitaxial growth process to add at least 2 μm of material to a workpiece. This material may be in-situ n-doped. In certain embodiments, the epitaxial growth process grows at least 3 μm of SiC material. A channeled implant of aluminum or another suitable p-type dopant is then performed to begin creation of the p-doped pillar 380. The concentration of the p-doped region is nearly uniform, such that the concentration throughout the thickness varies by less than an order of magnitude. In certain embodiments, a random implant may also be performed to increase the dopant concentration near the top surface. Following the implant, a second epitaxial growth process of at least 2 μm and a second channeled implant of aluminum are performed. In certain embodiments, the second epitaxial growth process grows at least 3 μm of SiC material. Again, in certain embodiments, a random implant may also be performed. These processes are repeated until the p-doped pillar 380 reaches the desired thickness. Once the p-doped pillar 380 is fully formed, a final epitaxial growth process may be performed to add the material that will constitute the current spreading layer 340, the p-wells 320 and the source areas 310. The remainder of the MOSFET may be fabricated using the sequence described above and shown in FIGS. 2A-2E.

The method described herein have many advantages. First, it is traditionally believed that the current spreading layer is best created using epitaxial growth so that the concentration remains relatively constant throughout the thickness of the current spreading layer. However, this may be a time consuming and expensive process. Thus, the ability to create the current spreading layer that is at least 0.8 μm thick using channeled ion implantation may significantly reduce the time to fabricate a SiC trench MOSFET. Thus, the final several microns of the SiC MOSFET may be epitaxially grown in one growth process, because all of the fabrication processes shown in FIGS. 2A-2E may be performed on the completely grown workpiece.

Further, the methods described herein also allows more efficient formation of super junction MOSFETs. As described above, the p-doped pillars 380 are usually formed by repeating a combination of an epitaxial growth and an implant process a large number of times. The ability to perform an implant that reaches at least 3 μm under the surface allows the number of epitaxial growth processes to be significantly reduced, as each epitaxial growth process may be used to grow more material. Thus, the epitaxial process is used to grow at least 3 μm of material, which is then implanted using a channeled implant. This improves throughput and reduces the number of processes that are used to create the device. In some embodiments, the number of epitaxial growth processes may be less than 50% of the number that are performed when conventional random implants are performed. In certain embodiments, the number of epitaxial growth processes is less than 33% of the number that are performed when conventional random implants are performed.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating a silicon carbide trench MOSFET, comprising:
   using a channeled implant to create a current spreading layer within a silicon carbide workpiece, wherein the current spreading layer has a thickness greater than 800 nanometers;
   implanting p-type ions into a region of the silicon carbide workpiece that is shallower than the current spreading layer to form a p-well;
   implanting n-type ions into a source area of the silicon carbide workpiece, wherein the source area is disposed above the p-well; and
   creating a trench that extends through the source area, the p-well and a portion of the current spreading layer and does not extend completely through the current spreading layer.

2. The method of claim 1, wherein a concentration profile throughout a thickness of the current spreading layer varies by a factor of 5 or less.

3. The method of claim 2, wherein the concentration profile throughout the thickness of the current spreading layer varies by a factor of 2 or less.

4. The method of claim 1, wherein the channeled implant is performed at a non-zero tilt angle.

5. The method of claim 4, wherein the channeled implant is performed at an angle within ±2° of a direction of a main crystallographic direction.

6. The method of claim 5, wherein the channeled implant is performed at an angle within ±1° of a direction of a main crystallographic direction.

7. The method of claim 1, wherein the channeled implant is performed at a non-zero twist angle.

8. The method of claim 1, wherein a single implant process is performed to create the current spreading layer.

9. The method of claim 1, wherein the current spreading layer extends to a depth of at least 1500 nanometers.

10. The method of claim 1, further comprising forming a shield between trenches, wherein forming the shield comprises:
    implanting p-type ions into the silicon carbide workpiece using one or more implants where at least one of the one or more implants is a channeled implant, wherein a depth of the shield extends from the top surface to a depth greater than the trench.

11. A method of fabricating a silicon carbide trench MOSFET, comprising:
    using a channeled implant to create a current spreading layer within a silicon carbide workpiece, wherein the current spreading layer has a thickness greater than 800 nanometers;
    implanting p-type ions into a region of the silicon carbide workpiece that is shallower than the current spreading layer to form a p-well;
    implanting n-type ions into a source area of the silicon carbide workpiece, wherein the source area is disposed above the p-well; and
    creating a trench that extends through the source area, the p-well and does not extend into the current spreading layer.

12. The method of claim 11, wherein a concentration profile throughout a thickness of the current spreading layer varies by a factor of 5 or less.

13. The method of claim 12, wherein the concentration profile throughout the thickness of the current spreading layer varies by a factor of 2 or less.

14. The method of claim 11, wherein the channeled implant is performed at a non-zero tilt angle.

15. The method of claim 14, wherein the channeled implant is performed at an angle within ±2° of a direction of a main crystallographic direction.

16. The method of claim 15, wherein the channeled implant is performed at an angle within ±1° of a direction of a main crystallographic direction.

17. The method of claim 11, wherein the channeled implant is performed at a non-zero twist angle.

18. The method of claim 11, wherein a single implant process is performed to create the current spreading layer.

19. The method of claim 11, wherein the current spreading layer extends to a depth of at least 1500 nanometers.

20. The method of claim 11, further comprising forming a shield between trenches, wherein forming the shield comprises:
- implanting p-type ions into the silicon carbide workpiece using one or more implants where at least one of the one or more implants is a channeled implant, wherein a depth of the shield extends from the top surface to a depth greater than the trench.

* * * * *